(12) United States Patent
Jen (10) Patent No.: US 6,274,400 B1
(45) Date of Patent: Aug. 14, 2001

(54) TRI-LAYER PROCESS FOR FORMING TFT MATRIX OF LCD WITH REDUCED MASKING STEPS

(75) Inventor: Tean-Sen Jen, Chiai (TW)

(73) Assignee: Hannstar Display, Inc., Taipei (TW)

( * ) Notice: Subject to any disclaimer, the term of this patent is extended or adjusted under 35 U.S.C. 154(b) by 0 days.

(21) Appl. No.: 09/708,882

(22) Filed: Nov. 8, 2000

(30) Foreign Application Priority Data

Feb. 25, 2000 (TW) ................................................. 89103433

(51) Int. Cl.[7] .............................. H01L 21/00; H01L 21/84
(52) U.S. Cl. ................................................. 438/30; 438/160
(58) Field of Search ........................... 438/30, 158, 160, 438/609

(56) References Cited

U.S. PATENT DOCUMENTS

| | | | |
|---|---|---|---|
| 5,010,027 | * 4/1991 | Possin et al. | 437/41 |
| 5,346,833 | 9/1994 | Wu | 437/4 |
| 5,478,766 | 12/1995 | Park et al. | 437/40 |

* cited by examiner

*Primary Examiner*—Richard Booth
*Assistant Examiner*—Angel Roman
(74) *Attorney, Agent, or Firm*—Laff, Whitesel & Saret, Ltd.; J. Warren Whitesel (57) ABSTRACT

A simplified tri-layer process for forming a thin film transistor matrix for a liquid crystal display is disclosed. By using a backside exposure technique twice, two masking steps for patterning an etch stopper layer, and an upper doped and a lower intrinsic semiconductor layers, respectively, can be omitted. Further, owing to the back-exposing energy for patterning the semiconductor layers is less than that for patterning the etch stopper layer, the resulting etch stopper layer is enclosed with the resulting semiconductor layers, and the contact of the two semiconductor layers can be achieved.

25 Claims, 13 Drawing Sheets

TRI-LAYER PROCESS FOR FORMING TFT MATRIX OF LCD WITH REDUCED MASKING STEPS

FIELD OF THE INVENTION

The present invention relates to a process for forming a thin film transistor (TFT) matrix for a liquid crystal display (LCD), and more particularly to a simplified tri-layer process for forming the TFT matrix with reduced masking steps.

BACKGROUND OF THE INVENTION

For conventional manufacturing processes of a TFTLCD, a tri-layer process and a back channel etch (BCE) process are main streams for forming the TFT matrix. Compared to a BCE structure, a tri-layer structure additionally includes an top nitride over the semiconductor layer as a etch stopper so that the etching step for defining a source/drain and channel region can be well controlled. Accordingly, the thickness of the active layer can be made to be thinner in the tri-layer structure than in the BCE structure, which is advantageous for the stability of resulting devices and performance in mass production. However, the provision of the additional etch stopper layer needs an additional masking step, thereby making the tri-layer process relatively complicated.

Conventionally, six to nine masking steps are required for either a BCE process or a tri-layer process. After the formation of the TFT matrix, a step of providing a black matrix around each pixel electrode region is generally required to improve the performance of the LCD. The provision of the black matrix after the process, however, will have difficulty in alignment.

On the other hand, the count of photo-masking and lithography steps directly affects not only the production cost but also the manufacturing time. Moreover, for each photo-masking and lithography step, the risks of mis-alignment and contamination may be involved so as to affect the production yield. Therefore, many efforts have been made to improve the conventional processes to reduce masking steps.

For example, for a BCE structure, U.S. Pat. Nos. 5,346,833 and 5,478,766 issued to Wu and Park et al., respectively, disclose 3 and/or 4 -mask processes for making a TFTLCD, which are incorporated herein for reference. By the way, it is to be noted that the 3-mask process for each of Wu and Park et al. does not include the step of forming and patterning of a passivation layer. If a passivation layer is required to assure of satisfactory reliability, the count of photo-masking and lithography steps should be four. Further, Wu and Park et al. use an ITO layer, which is integrally formed with the ITO pixel electrode, as the connection line between the TFT unit and the data line so that the area of the TFTLCD is limited due to the high resistivity of ITO.

Figure 1A:
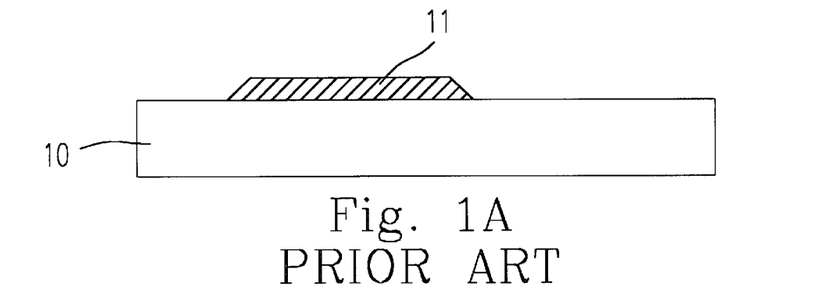
FIGS. 1A~1G are cross-sectional views of intermediate structures of a conventional TFTLCD, which schematically show the formation of the TFT matrix.
Figure 1B:
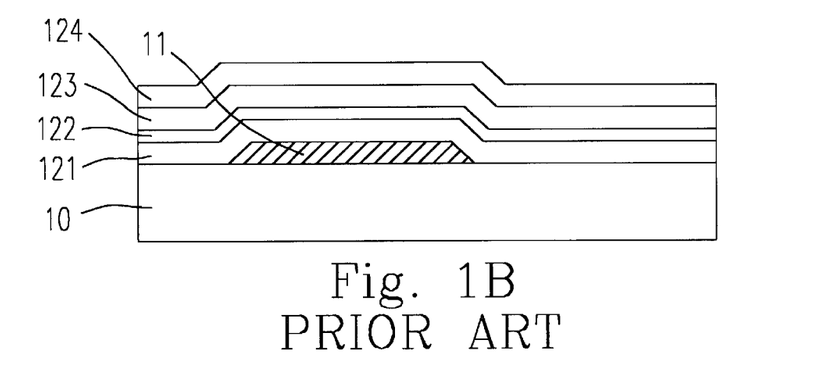
Figure 1C:
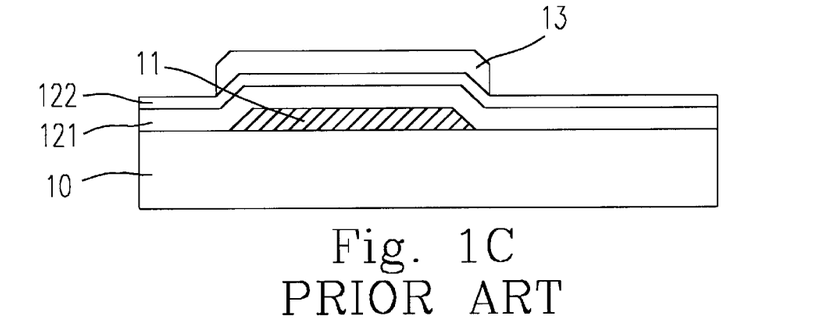
Figure 1D:
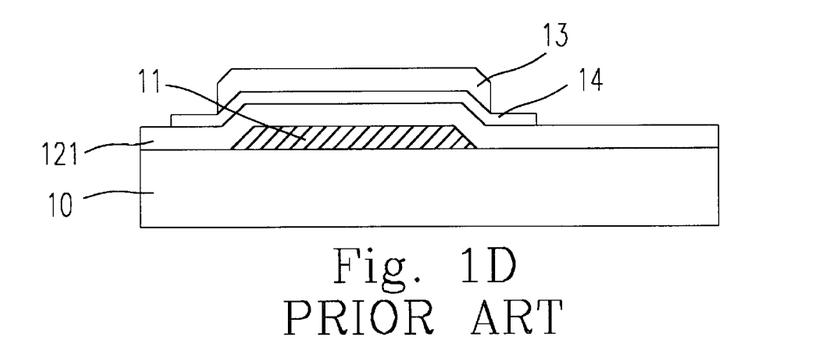
Figure 1E:
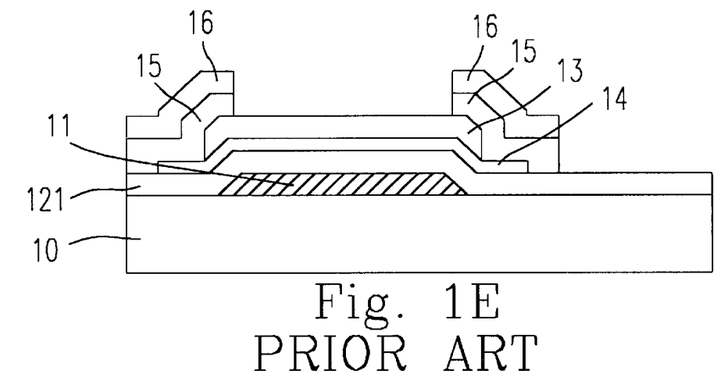
Figure 1F:
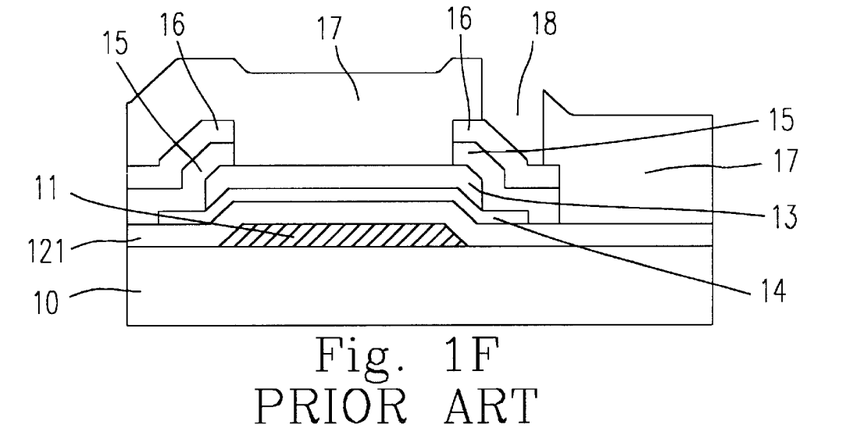
Figure 1G:
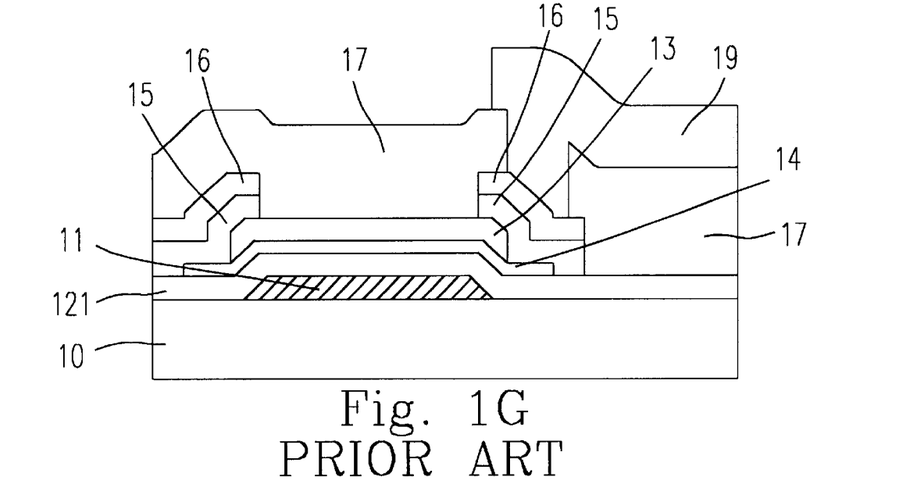

As for the tri-layer structure, a conventional 6-mask process is illustrated as follows with reference to FIGS. 1A~1G which are cross-sectional views of intermediate structures at different stages. The conventional process includes steps of:

i) applying a first conductive layer onto a glass substrate 10, and using a first photo-masking and lithography procedure to pattern and etch the first conductive layer to form an active region 11 consisting of a scan line and a gate electrode of a TFT unit, as shown in FIG. 1A;

ii) sequentially forming tri-layers including an insulation layer 121, a semiconductor layer 122 and an etch stopper layer 123, and a photoresist 124 on the resulting structure of FIG. 1A, as shown in FIG. 1B.

iii) using a second photo-masking and lithography procedure to pattern and etch the etch stopper layer 123 to form an etch stopper 13 which have a shape similar to the shape of the gate electrode, as shown in FIG. 1C;

iv) using a third photo-masking and lithography procedure to pattern and etch the semiconductor layer 122 to form a channel structure 14, as shown in FIG. 1D;

v) sequentially applying a doped semiconductor layer and a second conductive layer on the resulting structure of FIG. 1D, and using a fourth photo-masking and lithography procedure to pattern and etch them to form source/drain regions 15 and data and connection lines 16, as shown in FIG. 1E;

vi) applying a passivation layer 17 on the resulting structure of FIG. 1E, and using a fifth photo-masking and lithography procedure to pattern and etch the passivation layer 17 to create tape automated bonding (TAB) openings (not shown), and create a contact window 18, as shown in FIG. 1F; and vii) applying a transparent electrode layer on the resulting structure of FIG. 1F, and using a sixth photo-masking and lithography procedure to pattern and etch the transparent electrode layer to form a pixel electrode 19, as shown in FIG. 1G.

Six masking steps, however, are still too complicated.

SUMMARY OF THE INVENTION

Therefore, an object of the present invention is to provide a reduced mask process for forming a thin film transistor (TFT) matrix for a liquid crystal display (LCD), in which the count of photo-masking and lithography steps can be reduced to three.

Another object of the present invention is to provide a tri-layer process for forming a thin film transistor (TFT) matrix for a liquid crystal display (LCD), in which the connection line between a TFT unit and a data line has a relatively low resistivity compared to the ITO connection line so as to be suitable for a large-area TFTLCD.

According to a first aspect of the present invention, a process for forming a thin film transistor (TFT) matrix for a liquid crystal display (LCD) includes steps of providing a substrate made of an insulating material; forming a first conductive layer on a first side of the substrate, and using a first masking and patterning procedure to remove a portion of the first conductive layer to define a scan line and a gate electrode of a TFT unit; successively forming an insulation layer, a semiconductor layer, an etch stopper layer, and a first photoresist layer on the substrate with the scan line and the gate electrode; providing a first exposing source from a second side of the substrate opposite to the first side by using the scan line and the gate electrode as shields to obtain a first exposed area and a first unexposed area; removing the first photoresist layer, and the etch stopper layer of the first exposed area so that the remaining portion of the etch stopper layer in the first unexposed area has a specific shape similar to the shape of the scan line together with the gate electrode; forming a doped semiconductor layer and a second photoresist layer on the substrate with the etch stopper layer of the specific shape; providing a second exposing source from a second side of the substrate opposite to the first side by using the scan line and the gate electrode as shields to obtain a second exposed area and a second unexposed area; removing the second photoresist layer, the doped semiconductor layer of the second exposed area, and the semiconductor layer of the second exposed area so that shapes of remaining portions of the doped semiconductor layer and the semiconductor layer in the second unexposed area are similar to that of the etch stopper layer of the specific shape, but have areas larger than that of the etch stopper layer of the specific shape, thereby making the doped semiconductor layer in contact with the semiconductor layer; successively forming a transparent conductive layer and a second conductive layer on the substrate, and using a second masking and patterning procedure to remove a portion of the transparent conductive layer and a portion of the second conductive layer to define a pixel electrode region and data and connection lines, respectively; removing another portion of the doped semiconductor layer with a remaining portion of the second conductive layer as shields to define source/drain regions; forming a passivation layer on the substrate, and using a third masking and patterning procedure to remove a portion of the passivation layer; and removing another portion of the second conductive layer with the patterned passivation layer as shields to expose the pixel electrode region.

When the exposing sources are light radiation, the insulating material is a light-transmitting material such as glass.

In an embodiment, the second exposing source has an intensity less than an intensity of the first exposing source. For example, the intensity of the first exposing source is ranged between 1000–1500 $mJ/cm^2$, preferably about 1250 $mJ/cm^2$, and the intensity of the second exposing source is ranged between 400–600 $mJ/cm^2$, preferably about 500 $mJ/cm^2$.

In an alternative embodiment, the second exposing source is provided within a period of time less than a period of time within which the first exposing source is provided. For example, when the first and second exposing sources are of the same intensity, the period of time for providing the first exposing source is ranged between 400–600 ms, preferably about 500 ms, and the period of time for providing the second exposing source is ranged between 150–250 ms, preferably about 200 ms.

Of course, the second exposing source can be provided both weaker and shorter, or stronger but even shorter, or weaker but longer that the first exposing source is, as long as the purposes that the shapes of the remaining portions of the doped semiconductor layer and the semiconductor layer in the second unexposed area are similar to that of the etch stopper layer of the specific shape, but have areas larger than that of the etch stopper layer of the specific shape, and the doped semiconductor layer is in contact with the semiconductor layer are achieved.

Preferably, the first conductive layer is formed of chromium, molybdenum, tantalum, tantalum molybdenum, tungsten molybdenum, aluminum, aluminum silicide, copper, or a combination thereof.

Preferably, the insulation layer is formed of silicon nitride, silicon oxide, silicon oxynitride, tantalum oxide, aluminum oxide or a combination thereof.

Preferably, the etch stopper layer is formed of silicon nitride, silicon oxide, or silicon oxynitride.

Preferably, the semiconductor layer is formed of intrinsic amorphous silicon, micro-crystalline silicon or polysilicon, and the doped semiconductor layer is formed of highly doped amorphous silicon, highly doped micro-crystalline silicon or highly doped polysilicon.

Preferably, the transparent conductive layer is formed of indium tin oxide, indium zinc oxide or indium lead oxide.

Preferably, the second conductive layer is a chromium/ aluminum or a molybdenum/aluminum/molybdenum composite layers.

Preferably, the passivation layer is formed of silicon nitride or silicon oxynitride.

Preferably, the third masking and patterning procedure additionally removes portions of the etching stopper layer and the semiconductor layer to define an isolation window.

Preferably, the third masking and patterning procedure additionally defines a plurality of pad regions around the TFT matrix.

After the third masking and patterning procedure, it is preferred that a portion of the second conductive layer surrounding the pixel electrode remains as a black matrix.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following description of the preferred embodiment of this invention is presented herein for purpose of illustration and description only; it is not intended to be exhaustive or to be limited to the precise form disclosed.

Figure 2A:
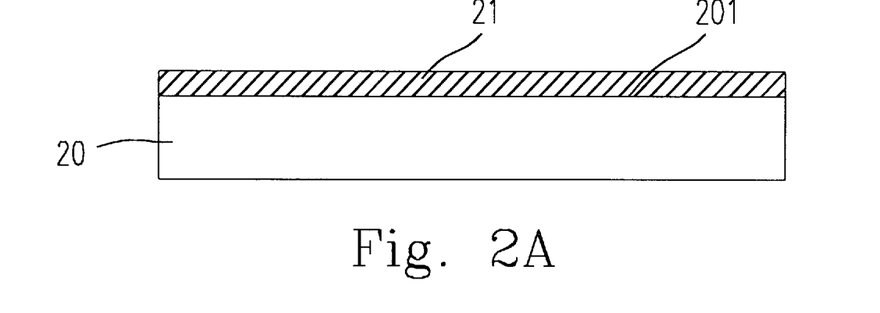
FIGS. 2A~2L are cross-sectional views of intermediate structures of a TFTLCD according to the present invention, which schematically show a preferred embodiment of a process for forming the TFT matrix.
Figure 2B:
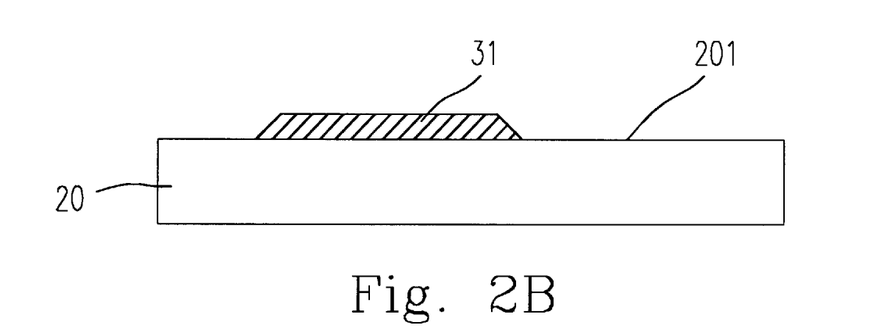
Figure 2C:
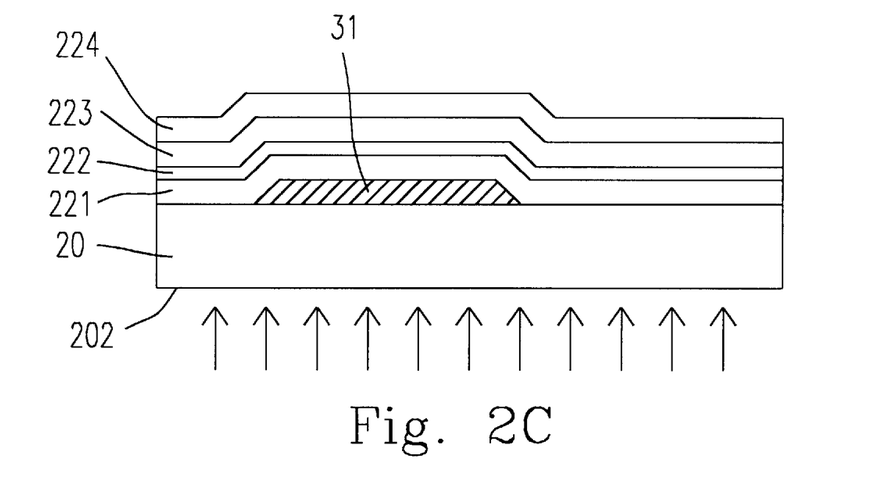
Figure 2D:
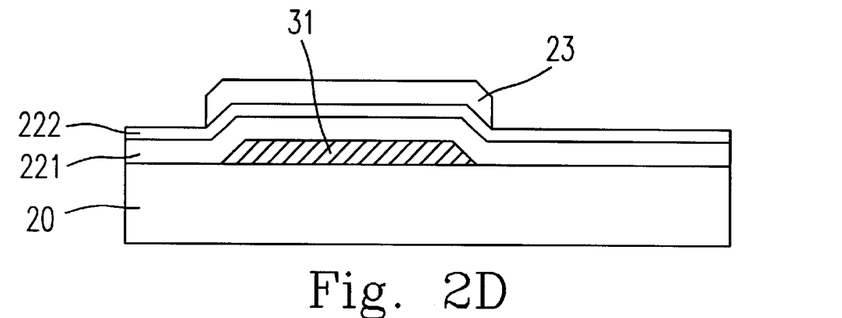
Figure 2E:
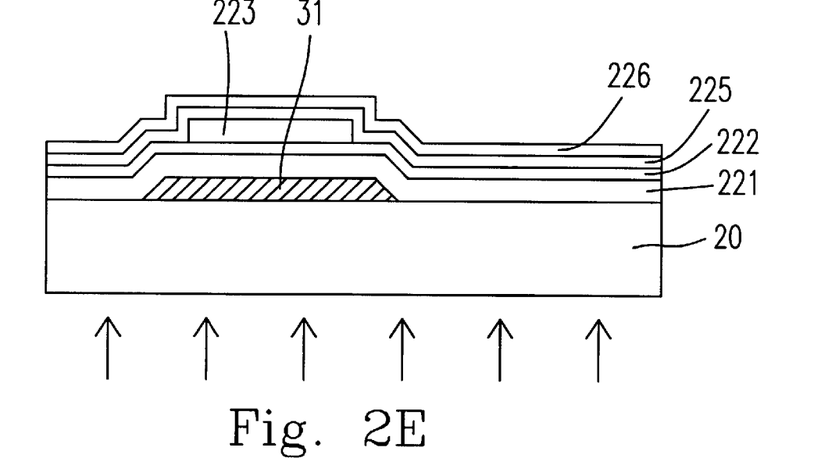
Figure 2F:
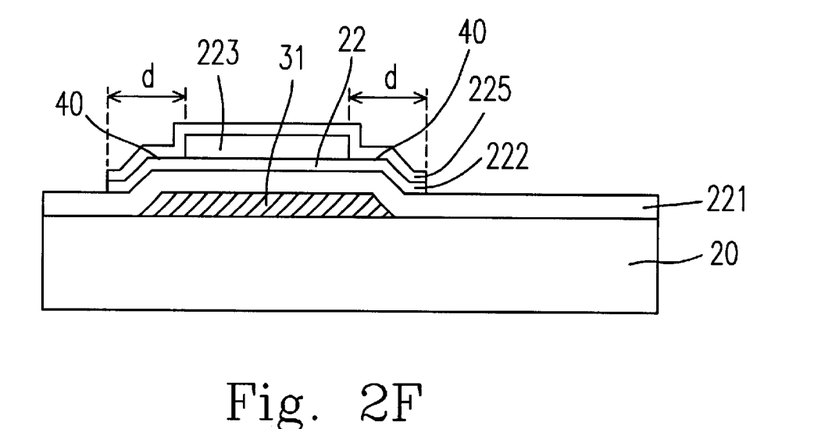
Figure 2G:
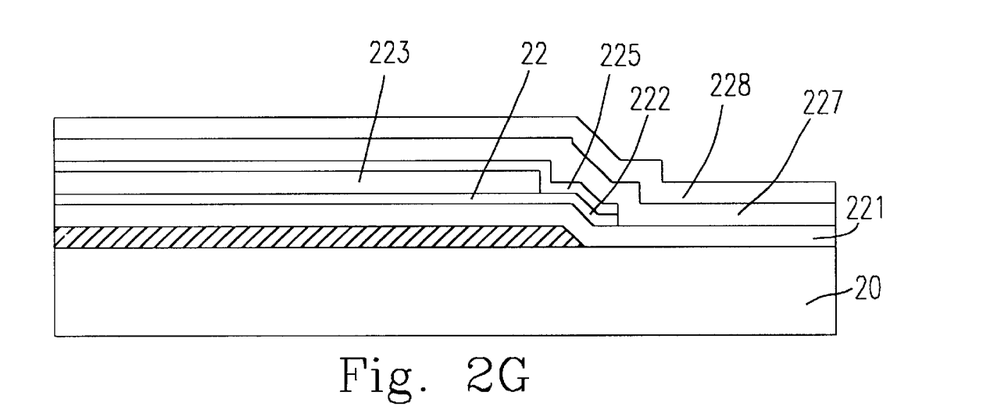
Figure 2H:
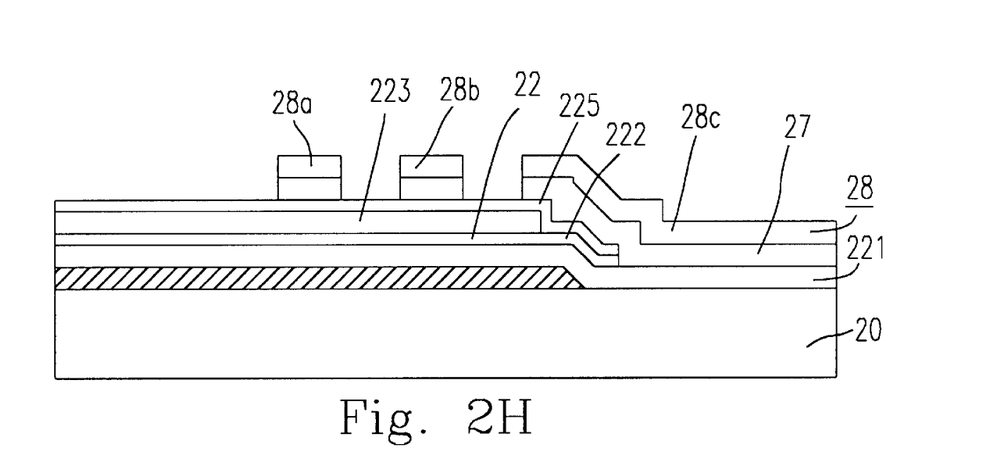
Figure 2I:
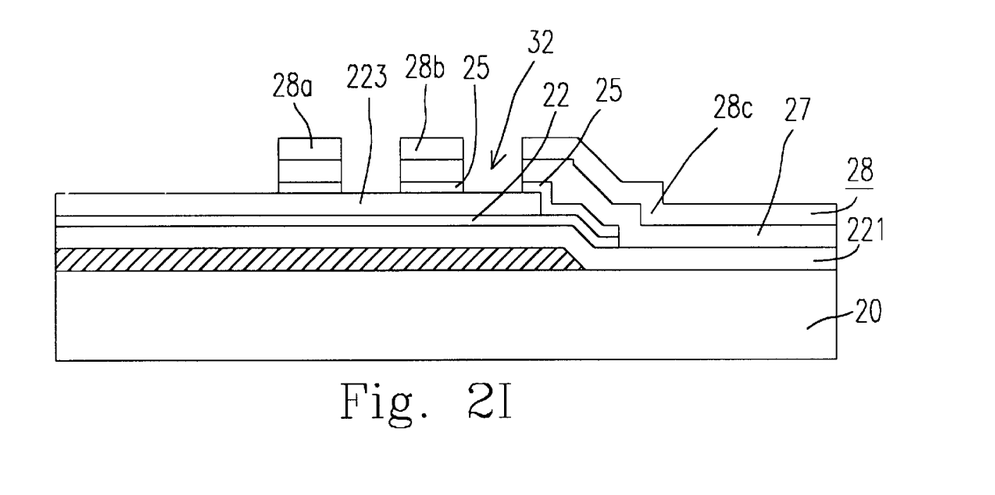
Figure 2J:
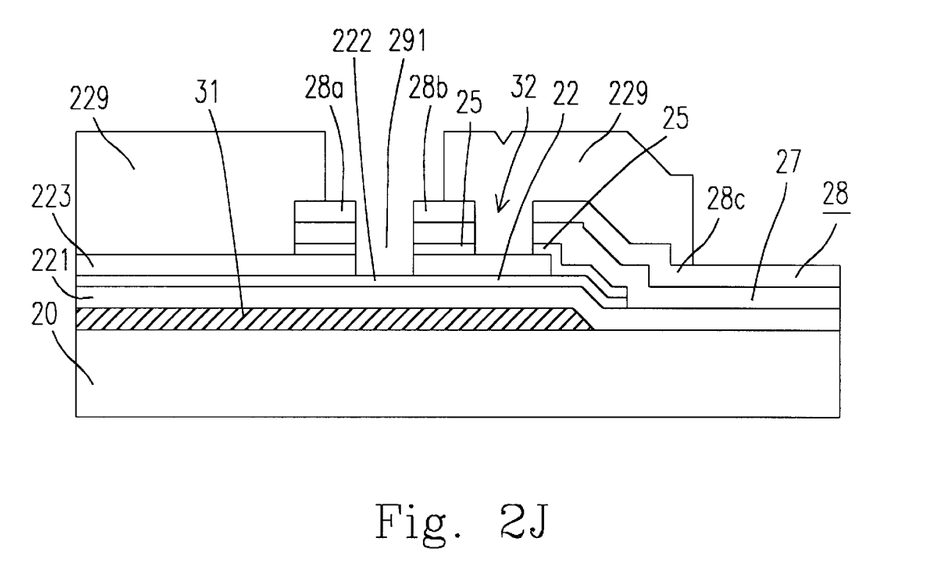
Figure 2K:
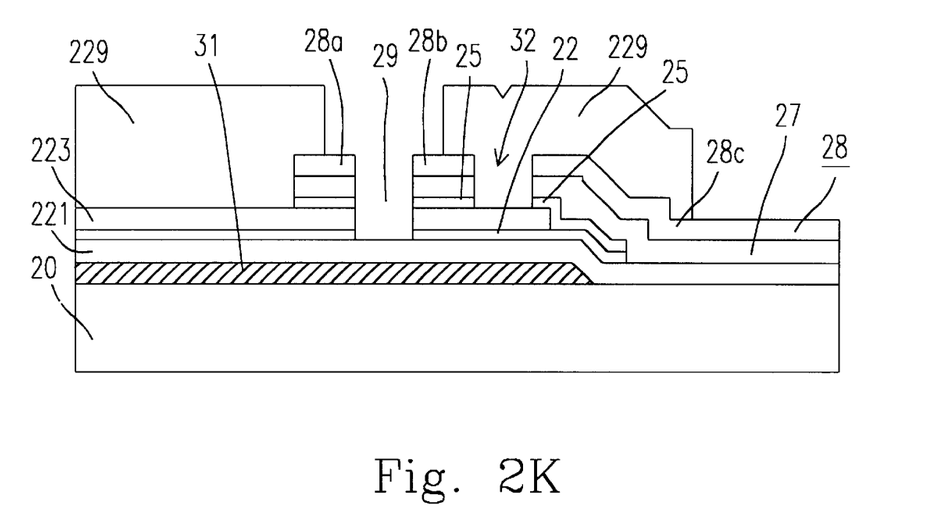
Figure 2L:
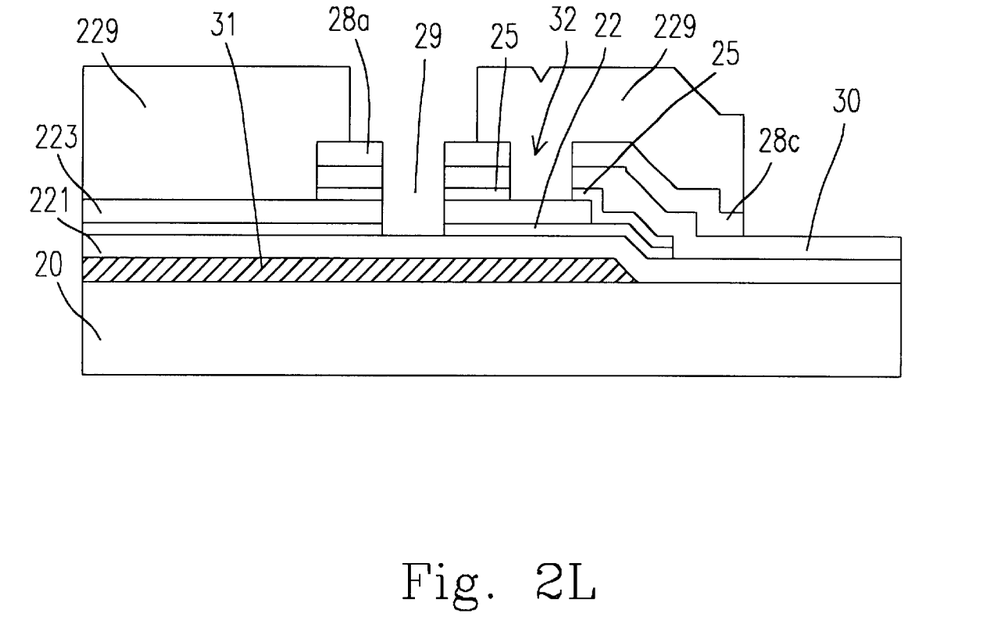
Figure 3A:
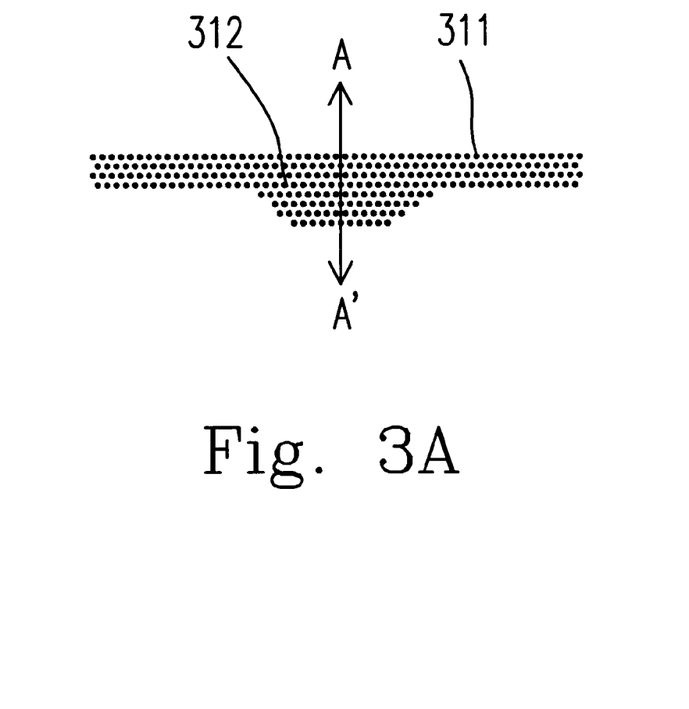
FIGS. 3A~3E are partial top plane views corresponding to the structures of FIGS. 2B, 2F, 2I, 2K and 2L, respectively.
Figure 3B:
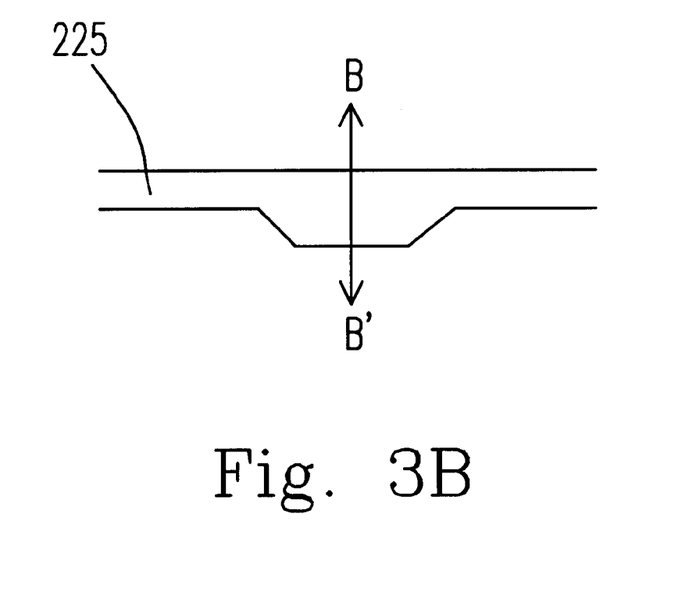
Figure 3C:
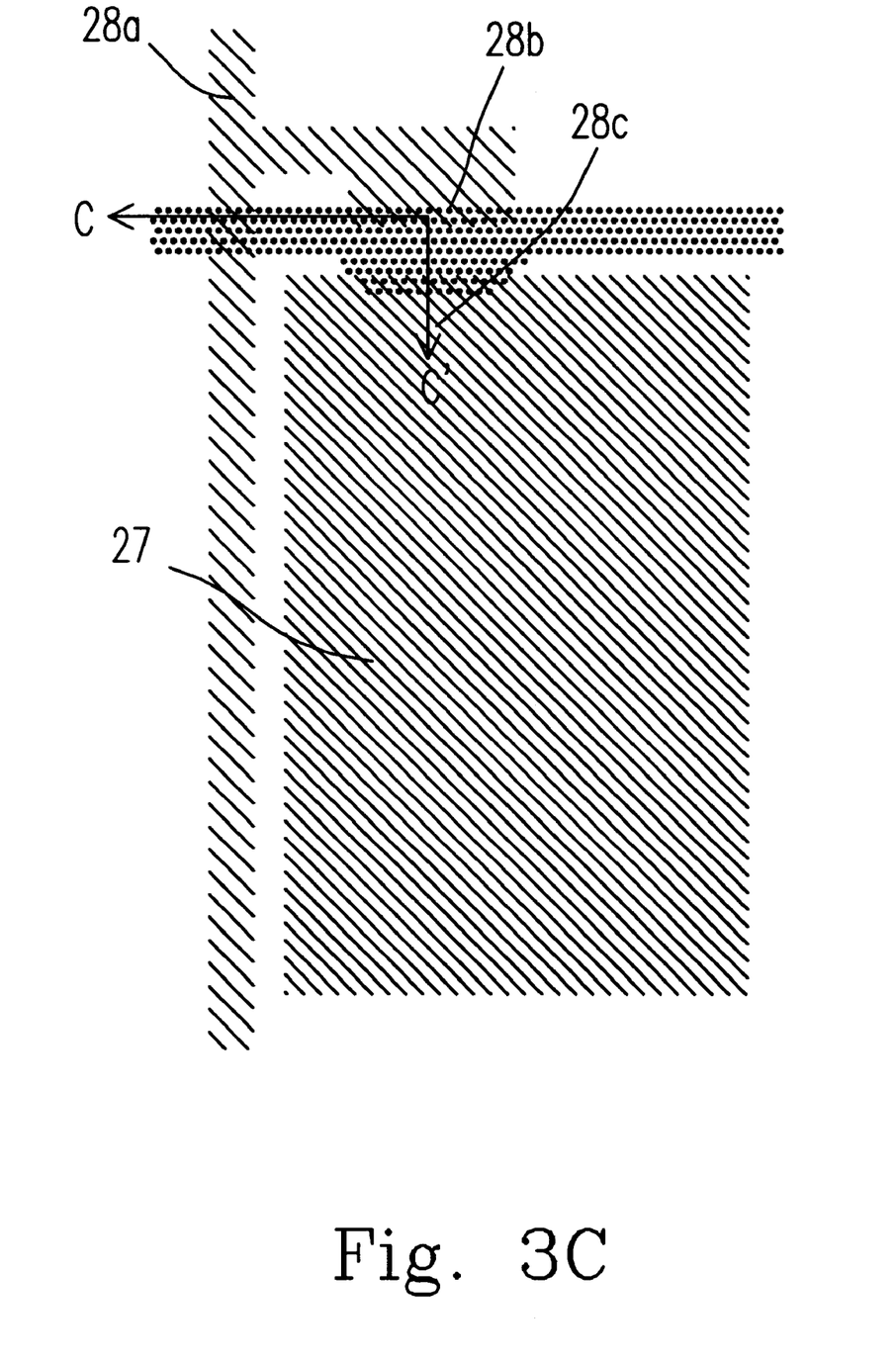
Figure 3D:
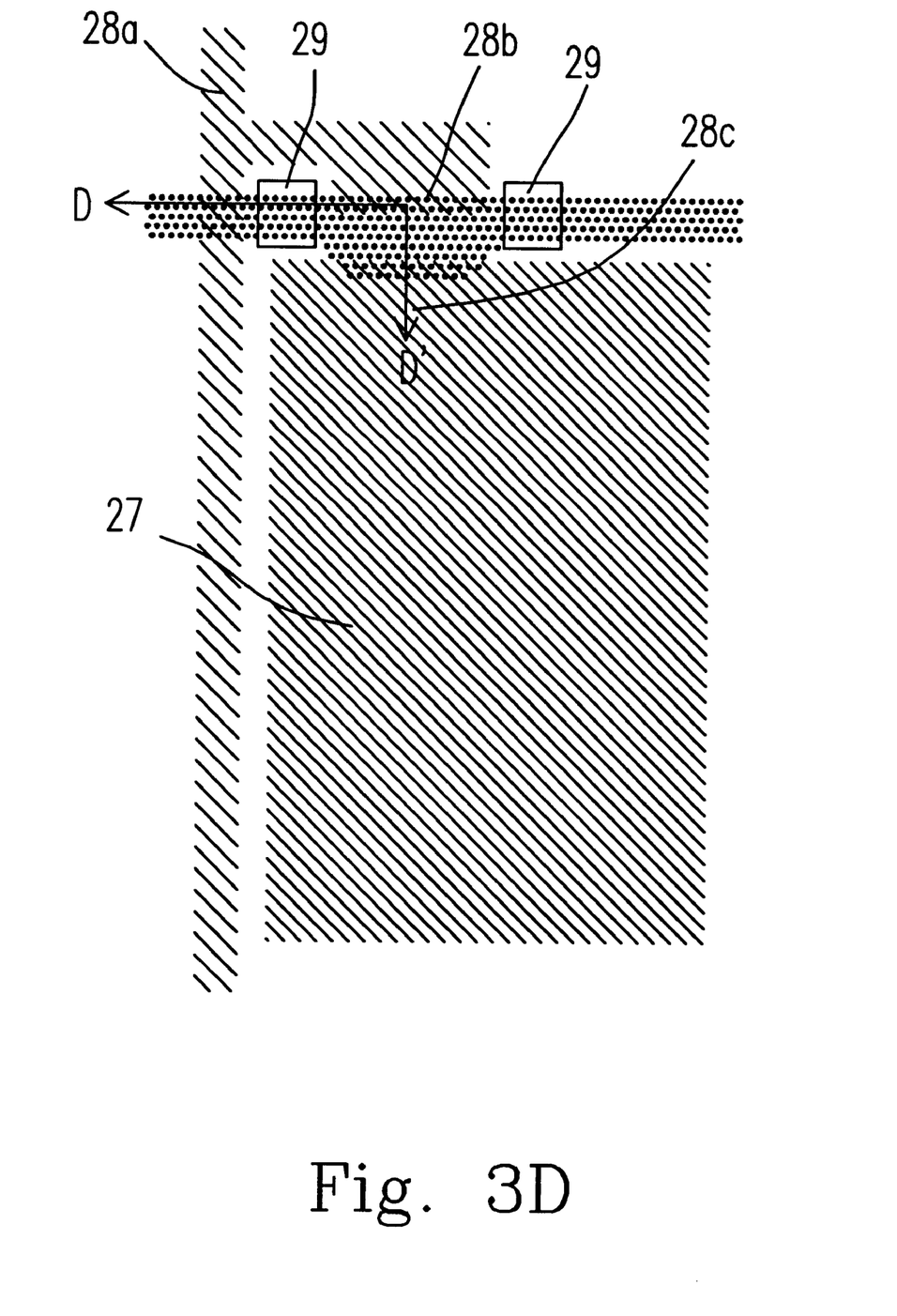
Figure 3E:
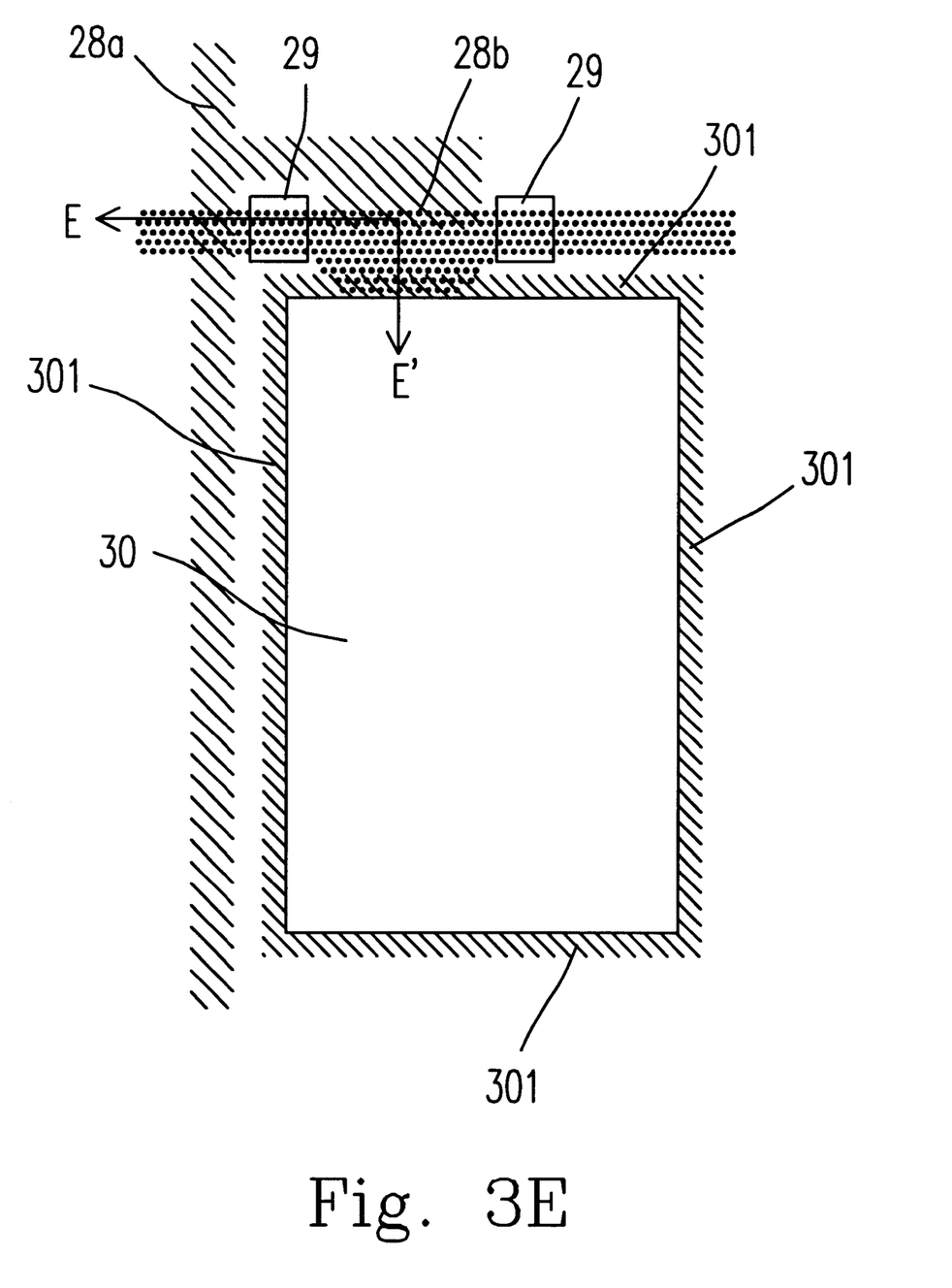
Figure 4:
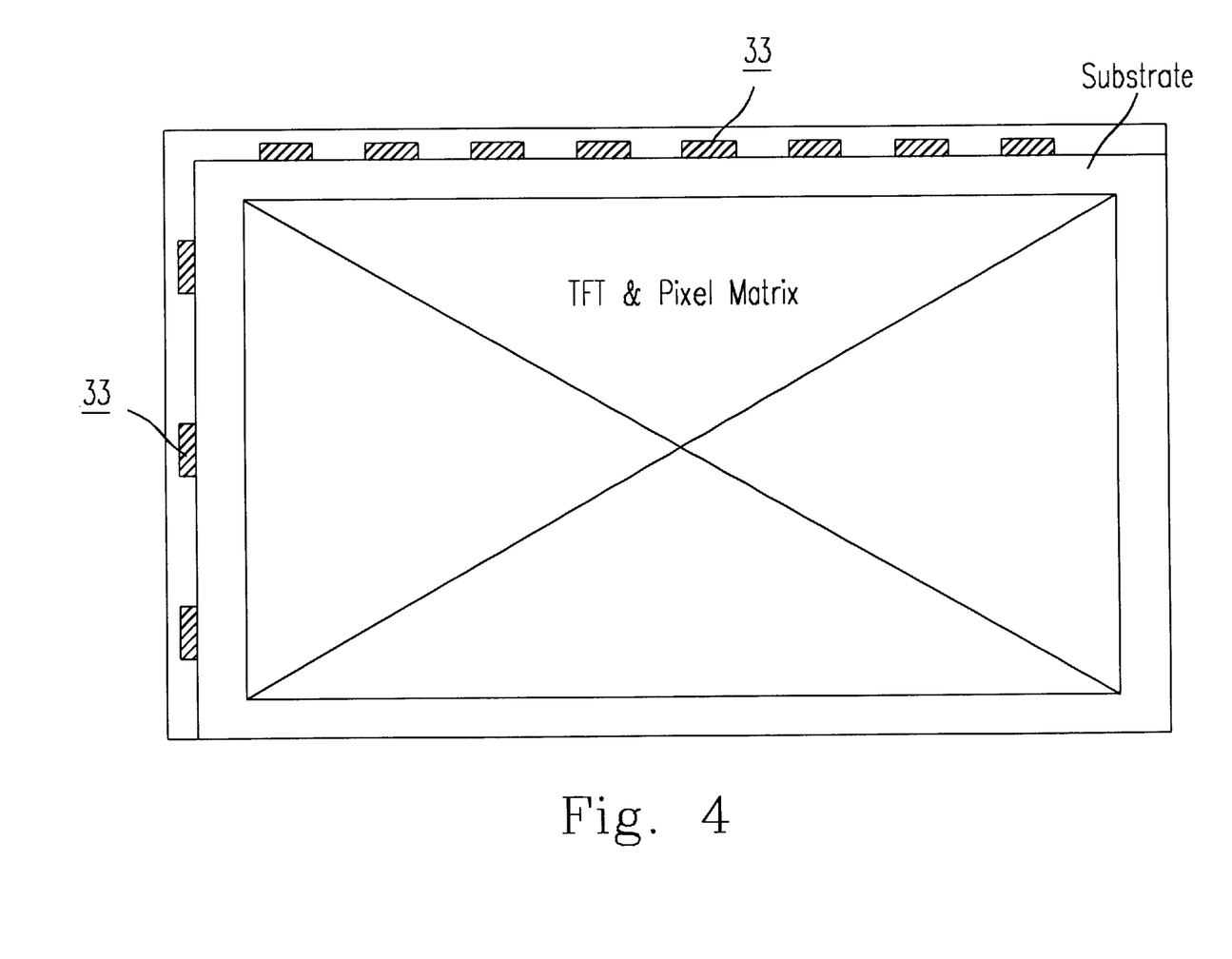
FIG. 4 is a partial top plane view schematically showing pad regions around the TFT matrix of a TFTLCD.

A preferred embodiment of a process for forming a TFT matrix of a TFTLCD according to the present invention directs to a three-mask process, and it is illustrated with reference to FIGS. 2A~2L. It is to be noted that the division of steps and the provision of serial numbers as below are for corresponding to the drawings, and for easy illustration and understanding, instead of critically indicating the separation or the integration of steps. The preferred embodiment of the process includes steps of:

i) applying a Cr layer 21 onto a front side 201 of a glass substrate 20 as a first conductive layer, as shown in FIG. 2A;

ii) using a first photo-masking and lithography procedure to pattern and etch the Cr layer 21 to form an active region 31 consisting of a scan line 311 and a gate electrode 312 of a TFT unit, as shown in FIGS. 2B and 3A wherein FIG. 2B is a cross-sectional view taken along the A—A line of FIG. 3A;

iii) consecutively and sequentially forming a silicon nitride layer 221 as an insulation layer, an intrinsic amorphous silicon (i-a-Si) layer 222 as a semiconductor layer, a top silicon nitride layer 223 as an etch stopper layer, and a photoresist 224 on the resulting structure of FIG. 2B, as shown in FIG. 2C, and exposing the resulting structure from the back side 202 of the substrate 20, as indicated by arrows, wherein a portion of the photoresist 224 above the region 31 is shielded by the region 31 from exposure so as to exhibit a self-aligned effect;

iv) etching off the exposed photoresist 224, a portion of the top silicon nitride layer 223 thereunder, and the remaining photoresist so that the remaining etch stopper structure 23 has a shape similar to the region 31, as shown in FIG. 2D and with reference to FIG. 3A;

v) applying an n+ amorphous silicon layer 225 on the resulting structure of FIG. 2D as a highly doped semiconductor layer, and then another photoresist layer 226, as shown in FIG. 2E, and exposing the resulting structure from the back side 202 of the substrate 20 with less energy than the exposure energy in step iii), as indicated by arrows, wherein a portion of the photoresist 226 above the region 31 is shielded by the region 31 from exposure so as to exhibit a self-aligned effect;

vi) etching off the exposed photoresist 226, a portion of the n+ amorphous silicon layer 225, a portion of the intrinsic amorphous silicon layer 222 and the remaining photoresist so that the remaining semiconductor layers 222 and 225 have shapes similar to the shape of the region 31 or the etch stopper structure 223, but have relatively large areas, as shown in FIG. 2F and with reference to FIG. 3B wherein FIG. 2F is a cross-sectional view taken along the B—B line of FIG. 3B, thereby defining a channel region 22 and achieving a contact 40 of the layers 222 and 225;

vii) sequentially applying an ITO layer 227 and a Cr/Al composite layer 228 on the resulting structure of FIG. 2F as a transparent conductive layer and a second conductive layer, respectively, as shown in FIG. 2G;

viii) using a second photo-masking and lithography procedure to pattern and etch the ITO layer 227 and the Cr/Al composite layer 228 to define a pixel electrode region 27 and data and connection lines 28, respectively, as shown in FIG. 2H;

ix) using the remaining Cr/Al layer as a shield to etch off a portion of the n+amorphous silicon layer 225 to define source/drain regions 25, as shown in FIG. 2I and with reference to FIG. 3C, wherein FIG. 2I is a cross-sectional view taken along the C—C line of FIG. 3C, and where the TFT unit 32 is formed;

x) applying a silicon nitride layer 229 on the resulting structure of FIG. 2I as a passivation layer, and using a third photo-masking and lithography procedure to pattern and etch the passivation layer 229 and the etch stopper layer 223 to define an isolation window area 291, expose a portion of the data and connection lines 28, as shown in FIG. 2J, and define tape automated bonding (TAB) openings as pad regions 33 around the TFT unit 32, as shown in FIG. 4;

xi) removing the i-a-Si layer 222 in the isolation window area 291 to create an isolation window 29, as shown in FIG. 2K and with reference to FIG. 3D wherein FIG. 2K is a cross-sectional view taken along the D—D line of FIG. 3D;

xii) removing another portion of the Cr/Al layer 228 in the pixel electrode region 27 with the patterned passivation layer as shields to define a pixel electrode 30, as shown in FIG. 2L and with reference to FIG. 3E wherein FIG. 2L is a cross-sectional view taken along the E—E line of FIG. 3E.

In the step i) of the above embodiment, the first conductive layer 21 can be applied by any suitable conventional technique which is not to be redundantly described here. In this embodiment, the substrate 20 is formed of glass which is transparent for allowing light type of exposing source to transmit therethrough. The substrate 20, however, can also be made of another transparent, translucent or opaque material, depending on the type of the exposing source. On the other hand, the first conductive layer 21 can also be formed of molybdenum, tantalum molybdenum, tungsten molybdenum, tantalum, aluminum, aluminum silicide or copper.

In the step ii) of the above embodiment, the photo-masking and lithography procedure can be performed by any suitable conventional technique which is not to be redundantly described here.

In the step iii) of the above embodiment, the insulation layer 221, semiconductor layer 222, etch stopper layer 223 and photoresist 224 can be applied by any suitable conventional techniques which are not to be redundantly described here. The insulation layer 221 can also be formed of silicon oxide, silicon oxynitride, tantalum oxide or aluminum oxide. The semiconductor layer 222 can also be formed of micro-crystalline silicon or polysilicon. The etch stopper layer 223 can also be formed of silicon oxide or silicon oxynitride. It is to be noted that the there preferably exists a high etching selectivity between the etching stopper layer 223 and the semiconductor layer 222 so that the etching procedure of the etching stopper layer will not damage the semiconductor layer. For example, the etching gas for the semiconductor layer is selected from a group consisting of carbon tetrafluoride ($CF_4$), boron trichloride ($BCl_3$), chlorine ($Cl_2$), sulfur hexafluoride ($SF_6$), and a mixture thereof. On the other hand, the etching gas for the etch stopper layer is selected from a group consisting of carbon tetrafluoride/hydrogen ($CF_4/H_2$), trifluoromethane ($CHF_3$), sulfur hexafluoride/hydrogen ($SF_6/H_2$), and a mixture thereof On the other hand, it is preferred that the exposing energy used in the step iii) is strong enough to define the photoresist 224 to obtain a pattern having a shape similar to the active region 31 but having an area slightly smaller than the active region 31.

In the step iv) of the above embodiment, the etching procedure can be performed by any suitable conventional technique which is not to be redundantly described here.

In the step v) of the above embodiment, the doped semiconductor layer 225 and photoresist 226 can be applied by any suitable conventional techniques which are not to be redundantly described here. The doped semiconductor layer 225 can also be formed of highly doped micro-crystalline silicon or highly doped polysilicon. It is to be noted that the there preferably exists a high etching selectivity between the semiconductor layer 222 and the insulation layer 221 and so that the etching procedure of the semiconductor layers 225 and 222 will not damage the insulation layer.

Figure 5:
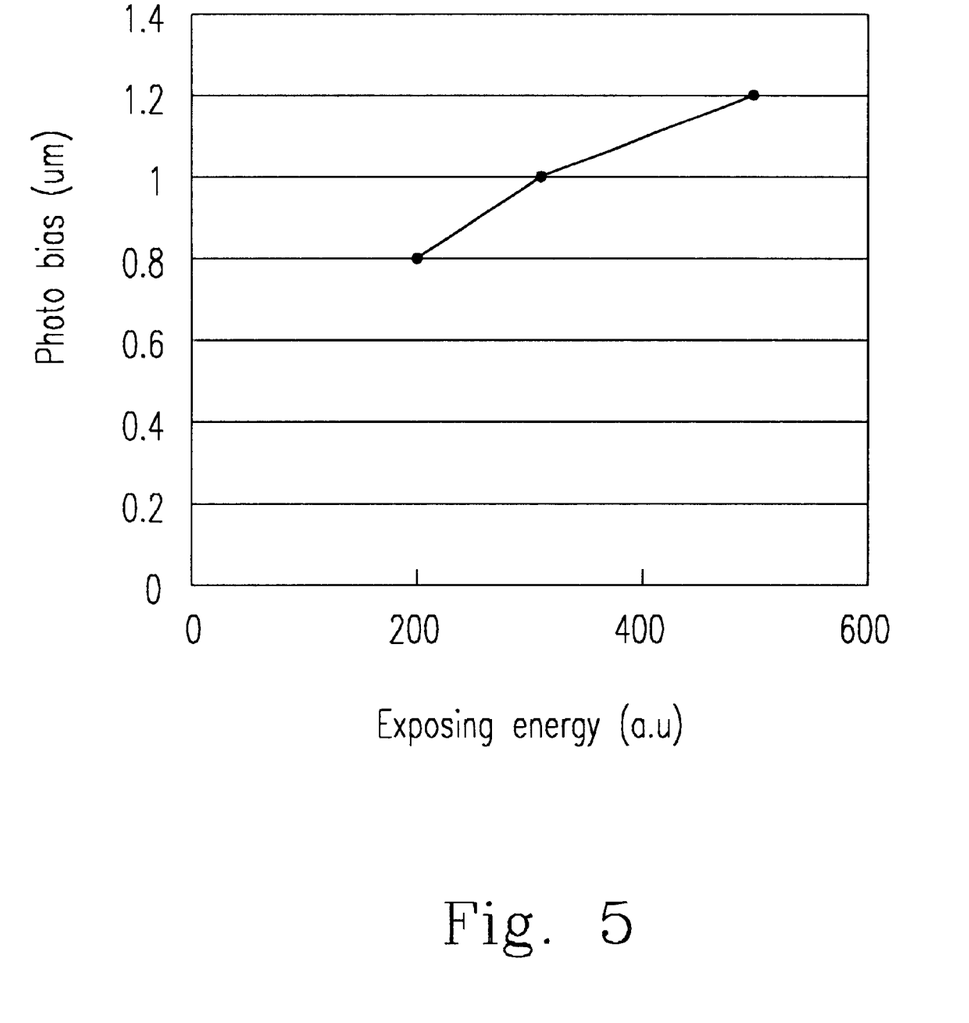
FIG. 5 is a photo bias vs. exposing energy plot for a certain exposing source.

On the other hand, the purpose of exposing the resulting structure from the back side 202 of the substrate 20 with less energy than the exposure energy in step iii) can be achieved by providing a weaker exposing source or a shorter exposing time. For example, the exposing intensity in step iii) is 1250 $mJ/cm^2$, and the exposing intensity in step v) is 500 $mJ/cm^2$. In an alternative example, when both of the exposing intensities are 500 $mJ/cm^2$, the exposing time in step iii) is 500 ms, and the exposing time in step v) is 200 ms. Owing to the back-exposing energy for patterning the semiconductor layers 225 and 222 is less than that for patterning the etch stopper layer 223, the relatively small etch stopper structure 223 is enclosed with the relatively large semiconductor layers 225 and 222 with a photo bias d (FIG. 2F) of about 0.2–0.7 microns, and preferably 0.4 microns. Accordingly, the contact 40 of the two semiconductor layers 225 and 222 can be achieved. FIG. 5 illustrates the relationship between photo bias in micrometer and exposing energy in arbit unit (a.u.) of a certain exposing source wherein 1 a.u.=2.5 mJ/cm$^2$. By adjusting the exposing energy of the exposing source, a proper photo bias is obtained so as to change the critical dimension of the photoresist mask. In other words, the quantity of the exposing energy has a highly effect on the critical dimension of a photoresist mask. Therefore, the top-view area of the patterned photoresist can be controlled by adjusting the exposing energy applied thereon.

In the step vi) of the above embodiment, the etching procedure can be performed by any suitable conventional technique which is not to be redundantly described here.

In the step vii) of the above embodiment, the transparent conductive layer 227 and the second conductive layer 228 can be applied by any suitable conventional techniques which are not to be redundantly described here. In this embodiment, the transparent conductive layer 227 can also be formed of indium zinc oxide or indium lead oxide. The second conductive layer 228 can also be a Mo/Al/Mo layer.

In the step viii) of the above embodiment, the photo-masking and lithography procedure and the etching procedure can be performed by any suitable conventional techniques which are not to be redundantly described here. The term "data and connection lines 28" used herein includes a data line 28a, a connection line 28b and an additional portion 28c, wherein the first connection line 28b connects the data line 28a and the TFT unit 32, and the additional portion 28c will be further etched in the step xii) to leave a portion surrounding the pixel electrode 30 to serve as a black matrix 301.

In the step ix) of the above embodiment, the etching procedure can be performed by any suitable conventional technique which is not to be redundantly described here.

In the step x) of the above embodiment, the passivation layer 229 can be applied by any suitable conventional technique which is not to be redundantly described here. The passivation layer 229 can also be formed of silicon oxynitride. On the other hand, the photo-masking and lithography procedure can be performed by any suitable conventional technique which is not to be redundantly described here.

In the step xi) of the above embodiment, the etching procedure can be performed by any suitable conventional technique which is not to be redundantly described here. It is to be noted that the formation of the isolation window 29 and thus the definition of the isolation window area 291 are not essential to the TFT matrix. The high impedance of the channel region 22 may exhibit an isolation effect to some extent.

In the step xii) of the above embodiment, the etching procedure can be performed by any suitable conventional technique which is not to be redundantly described here.

According to the process mentioned above, the formation of the etch stopper structure 223 is performed by a backside exposure technique as disclosed in the step iii), which uses the existent active region as shields so that one masking step is omitted. The formation of the channel region 22 is performed by another backside exposure technique as disclosed in the step v), which also uses the existent active region as shields so that another masking step is omitted. Further, in this embodiment, the transparent conductive layer is formed before the second conductive layer rather than after the passivation layer. Therefore, an additional masking and patterning procedure for creating the contact via for exposing the data and connection lines can be omitted. In other words, in this embodiment, only three masking and patterning procedures are required.

Moreover, there is an additional advantage by having the transparent conductive layer formed before the second conductive layer. After a portion of the second conductive layer is further removed after the third masking and patterning procedure, a remaining portion of the second conductive layer surrounding the pixel electrode can function as black matrix, as shown in FIG. 3E.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for forming a thin film transistor (TFT) matrix for a liquid crystal display (LCD), comprising steps of:

providing a substrate made of an insulating material;

forming a first conductive layer on a first side of said substrate, and using a first masking and patterning procedure to remove a portion of said first conductive layer to define a scan line and a gate electrode of a TFT unit;

successively forming an insulation layer, a semiconductor layer, an etch stopper layer, and a first photoresist layer on said substrate with said scan line and said gate electrode;

providing a first exposing source from a second side of said substrate opposite to said first side by using said scan line and said gate electrode as shields to obtain a first exposed area and a first unexposed area;

removing said first photoresist layer, and said etch stopper layer of said first exposed area so that the remaining portion of said etch stopper layer in said first unexposed area has a specific shape similar to the shape of said scan line together with said gate electrode;

forming a doped semiconductor layer and a second photoresist layer on said substrate with said etch stopper layer of said specific shape;

providing a second exposing source from a second side of said substrate opposite to said first side by using said scan line and said gate electrode as shields to obtain a second exposed area and a second unexposed area;

removing said second photoresist layer, said doped semiconductor layer of said second exposed area, and said semiconductor layer of said second exposed area so that shapes of remaining portions of said doped semiconductor layer and said semiconductor layer in said second unexposed area are similar to that of said etch stopper layer of said specific shape, but have areas larger than that of said etch stopper layer of said specific shape, thereby making said doped semiconductor layer in contact with said semiconductor layer;

successively forming a transparent conductive layer and a second conductive layer on said substrate, and using a second masking and patterning procedure to remove a portion of said transparent conductive layer and a portion of said second conductive layer to define a pixel electrode region and data and connection lines, respectively;

removing another portion of said doped semiconductor layer with a remaining portion of said second conductive layer as shields to define source/drain regions;

forming a passivation layer on said substrate, and using a third masking and patterning procedure to remove a portion of said passivation layer; and removing another portion of said second conductive layer in said pixel electrode region with said patterned passivation layer as shields to define a pixel electrode.

2. The process according to claim 1 wherein said insulating material is a light-transmitting material, and said exposing source is a light radiation.

3. The process according to claim 2 wherein said light-transmitting material is glass.

4. The process according to claim 1 wherein said first conductive layer is formed of a material selected from a group consisting of chromium, molybdenum, tantalum, tantalum molybdenum, tungsten molybdenum, aluminum, aluminum silicide, copper and a combination thereof.

5. The process according to claim 1 wherein said insulation layer is formed of a material selected from a group consisting of silicon nitride, silicon oxide, silicon oxynitride, tantalum oxide, aluminum oxide, and a combination thereof.

6. The process according to claim 1 wherein said etch stopper layer is formed of a material selected from a group consisting of silicon nitride, silicon oxide, and silicon oxynitride.

7. The process according to claim 1 wherein said semiconductor layer is formed of a material selected from a group consisting of intrinsic amorphous silicon, micro-crystalline silicon and polysilicon.

8. The process according to claim 1 wherein said doped semiconductor layer is formed of a material selected from a group consisting of highly doped amorphous silicon, highly doped micro-crystalline silicon and highly doped polysilicon.

9. The process according to claim 1 wherein said second exposing source has an intensity less than an intensity of said first exposing source.

10. The process according to claim 9 wherein said intensity of said first exposing source is ranged between 1000–1500 mJ/cm$^2$.

11. The process according to claim 10 wherein said intensity of said first exposing source is about 1250 mJ/cm$^2$.

12. The process according to claim 11 wherein said intensity of said second exposing source is ranged between 400–600 mJ/cm$^2$.

13. The process according to claim 12 wherein said intensity of said second exposing source is about 500 mJ/cm$^2$.

14. The process according to claim 1 wherein said second exposing source is provided within a period of time less than a period of time within which said first exposing source is provided.

15. The process according to claim 14 wherein said first and second exposing sources are of the same intensity.

16. The process according to claim 15 wherein said period of time for providing said first exposing source is ranged between 400–600 ms.

17. The process according to claim 16 wherein said period of time for providing said first exposing source is about 500 ms.

18. The process according to claim 17 wherein said period of time for providing said second exposing source is ranged between 150–250 ms.

19. The process according to claim 18 wherein said period of time for providing said second exposing source is about 200 ms.

20. The process according to claim 1 wherein said transparent conductive layer is formed of a material selected from a group consisting of indium tin oxide, indium zinc oxide and indium lead oxide.

21. The process according to claim 1 wherein said second conductive layer is one selected from a group consisting of a chromium/aluminum and a molybdenum/aluminum/molybdenum composite layers.

22. The process according to claim 1 wherein said passivation layer is formed of a material selected from a group consisting of silicon nitride and silicon oxynitride.

23. The process according to claim 1 wherein said third masking and patterning procedure additionally removes portions of said etching stopper layer and said semiconductor layer to define an isolation window.

24. The process according to claim 1 wherein said third masking and patterning procedure additionally defines a plurality of pad regions around said TFT matrix.

25. The process according to claim 1 wherein after said third masking and patterning procedure, a portion of said second conductive layer surrounding said pixel electrode remains as a black matrix.

* * * * *